United States Patent
Shen et al.

(10) Patent No.: US 8,964,445 B1
(45) Date of Patent: Feb. 24, 2015

(54) FERROELECTRIC RANDOM ACCESS MEMORY WITH ISOLATED POWER SUPPLY DURING WRITE AND WRITE-BACK CYCLES

(71) Applicants: Texas Instruments Incorporated, Dallas, TX (US); Texas Instruments Deutschland GmbH, Freising (DE)

(72) Inventors: Ge Shen, Shanghai (CN); Norbert Reichel, Wartenberg (DE); Hao Meng, Shanghai (CN); Xiaojiong Fe, Shanghai (CN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/080,000

(22) Filed: Nov. 14, 2013

Related U.S. Application Data

(60) Provisional application No. 61/882,207, filed on Sep. 25, 2013.

(51) Int. Cl.
*G11C 11/22* (2006.01)

(52) U.S. Cl.
CPC ........ *G11C 11/2297* (2013.01); *G11C 11/2275* (2013.01)
USPC ........... 365/145; 365/203; 365/149; 365/227; 365/220; 365/229

(58) Field of Classification Search
CPC .... G11C 11/22; G11C 11/2297; G11C 29/02; G11C 29/023; G11C 29/028; G11C 5/148; G11C 11/221; G11C 11/412
USPC ........... 365/145, 203, 149, 189.09, 227, 117, 365/189.15, 196, 210.1
See application file for complete search history.

(56) References Cited

U.S. PATENT DOCUMENTS 5,930,161 A * 7/1999 Sheikholeslami et al. . 365/49.13

* cited by examiner

*Primary Examiner* — Thong Q Le
(74) *Attorney, Agent, or Firm* — John R. Pessetto; Frederick J. Telecky, Jr.

(57) ABSTRACT

In an embodiment of the invention, a method is provided for isolating a ferroelectric memory from a power supply during a write-back cycle or a write cycle of the ferroelectric memory. After it is determined that a write-back cycle or a write cycle will occur in the ferroelectric memory, the power supply is electrically disconnected from the ferroelectric memory before a write-back cycle or a write cycle occurs. Energy during the write-back cycle or the write cycle is provided to the ferroelectric memory by one or more capacitors in this embodiment. After the write-back cycle or the write cycle has ended, the power supply is electrically connected to the ferroelectric memory and the capacitors.

19 Claims, 4 Drawing Sheets

FERROELECTRIC RANDOM ACCESS MEMORY WITH ISOLATED POWER SUPPLY DURING WRITE AND WRITE-BACK CYCLES

BACKGROUND

This invention is in the field of solid-state memory of the ferroelectric type. Embodiments of this invention are directed to circuit techniques for improving write and write-back signal margin in ferroelectric random access memories (FRAMs).

Many modern electronic devices and systems now include substantial computational capability for controlling and managing a wide range of functions and useful applications. Many of these electronic devices and systems are now portable or handheld devices. For example, many mobile devices with significant computational capability are now available in the market, including modern mobile telephone handsets such as those commonly referred to as "smartphones", personal digital assistants (PDAs), mobile Internet devices, tablet-based personal computers, handheld scanners and data collectors, personal navigation devices, implantable medical devices, and the like.

A recently developed technology for realizing non-volatile solid-state memory devices involves the construction of capacitors in which the dielectric material is a polarizable ferroelectric material, such as lead zirconate titanate (PZT) or strontium-bismuth-tantalate (SBT). Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits, for example by forming the capacitors above the transistor level, between overlying levels of metal conductors.

The data storage mechanism of FRAM cells is the charge-voltage hysteresis of the ferroelectric capacitor dielectric. The charge stored across the conductive plates of the ferroelectric capacitor depends on the voltage applied to the plates and also on the recent history of that voltage. If the voltage applied across the capacitor plates exceeds a "coercive" voltage, the capacitor polarizes into the "+1" state. According to this characteristic, once polarized to the "+1" state, so long as voltage remains above coercive voltage, the capacitor exhibits a stored charge of $Q_1$. Conversely, if an applied voltage is more negative than coercive voltage, the capacitor is polarized into the "-1" state, and will exhibit a stored charge of $-Q_2$.

An important characteristic of ferroelectric capacitors, for purposes of non-volatile storage in integrated circuits, is the difference in capacitance exhibited by a ferroelectric capacitor its two polarized states. As fundamental in the art, the capacitance of an element refers to the ratio of stored charge to applied voltage. In the context of a ferroelectric capacitor, the change in polarization state that occurs upon application of a polarizing voltage is reflected by the amount of charge stored by the capacitor as a result.

Reading an FRAM memory cell can be destructive (i.e. a memory cell loses its data). As result of an FRAM memory cell losing its data after a read, the memory cell in an FRAM memory must be written back to the memory cell. This procedure is often called "write-back." An FRAM memory cell may also be written to directly. This procedure is called a "write" to the FRAM memory cell. When a FRAM memory cell is written or written back, it is important that electrical noise surrounding the FRAM be kept as low as possible. In a case where electrical noise is high, the write or write-back of an FRAM cell may be corrupted by the electrical noise.

DETAILED DESCRIPTION OF THE INVENTION

In an embodiment of the invention, a method is provided for isolating a ferroelectric memory from a power supply during a write-back cycle or a write cycle of the ferroelectric memory. After it is determined that a write-back cycle or a write cycle will occur in the ferroelectric memory, the power supply is electrically disconnected from the ferroelectric memory before a write-back cycle or a write cycle occurs. Energy during the write-back cycle or the write cycle is provided to the ferroelectric memory by one or more capacitors in this embodiment. After the write-back cycle or the write cycle has ended, the power supply is electrically connected to the ferroelectric memory and the capacitors.

This invention is suitable for use in connection with semiconductor memory circuits, whether serving as a stand-alone integrated circuit or as embedded into larger scale integrated circuits such as microprocessors, microcontrollers, or the so-called "system on a chip" (SoC) integrated circuits. This invention is also suitable for use in logic circuits, including combinational and sequential logic circuits, as well as programmable logic circuits. Examples of embodiments of this invention in memory will be described in this specification, it being understood that such descriptions of implementations of this invention are not to be interpreted in a limiting fashion.

Figure 1:
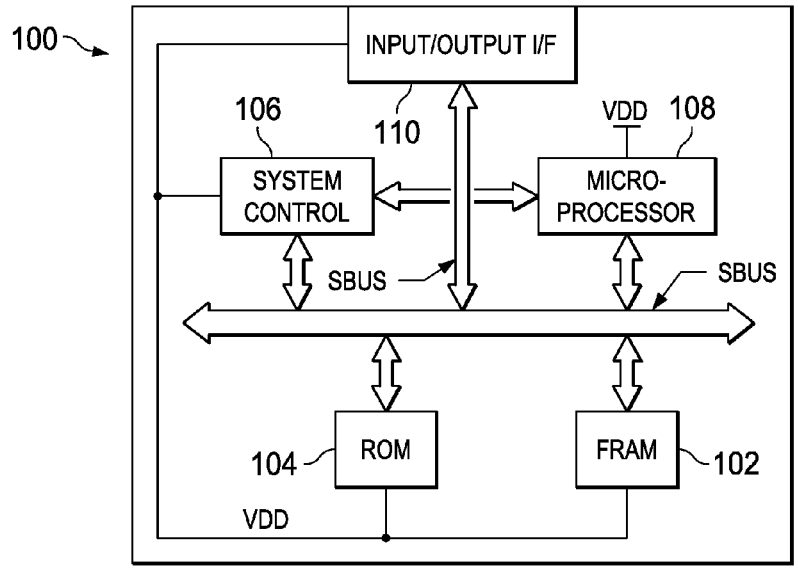
FIG. 1 is an electrical diagram, in block form, of a large scale integrated circuit incorporating a ferroelectric memory. (Prior Art)

FIG. 1 illustrates an example of SoC large-scale integrated circuit 100, which is a single-chip integrated circuit into which an entire computer architecture is realized. As such, in this example, integrated circuit 100 includes a central processing unit of microprocessor 108, which is connected to system bus SBUS. Various memory resources, including ferroelectric random access memory (FRAM) 102 and read-only memory (ROM) 104, reside on system bus SBUS and are thus accessible to microprocessor 108. Typically, ROM 104 serves as program memory, storing the program instructions executable by microprocessor 108, while FRAM 102 serves as data memory; in some cases, program instructions may reside in FRAM 102 for recall and execution by microprocessor 12. Other system functions are shown, in a generic sense, in integrated circuit 100 by way of system control 106 and input/output interface 100. In this example, all system blocks are electrically connected to power supply VDD.

Those skilled in the art having reference to this specification will recognize that integrated circuit 100 may include additional or alternative functions to those shown in FIG. 1, or may have its functions arranged according to a different architecture from that shown in FIG. 1. The architecture and functionality of integrated circuit 100 is thus provided only by way of example, and is not intended to limit the scope of this invention.

Figure 2A:
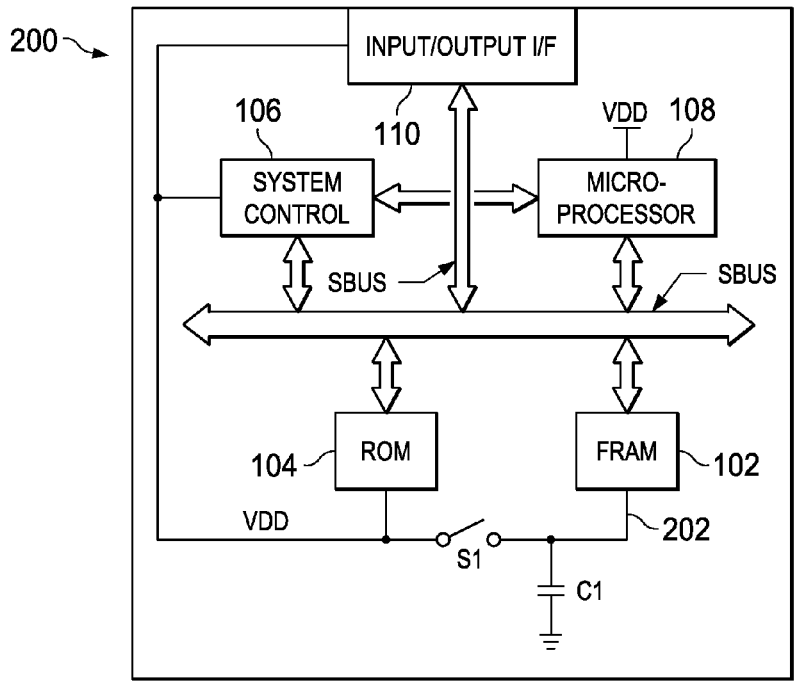
FIG. 2A is an electrical diagram, in block form, of a large scale integrated circuit incorporating a ferroelectric memory, constructed according to embodiments of the invention.

FIG. 2A is an electrical diagram, in block form, of a large scale integrated circuit incorporating a ferroelectric memory, constructed according to embodiments of the invention. In this embodiment of the invention, a switch S1 has been added between the power supply VDD and the power terminal 202 for FRAM 102. In addition, a capacitor C1 is electrically connected to the power terminal 202. In this example a single capacitor C1 is used. However, additional capacitors may be added in parallel with C1 in other embodiments. The switch S1 is "open" (i.e. not electrically connected to power terminal 202) when a write-back cycle or a write cycle occurs in the FRAM 102. The switch S1 is "closed" (i.e. electrically connected to power terminal 202) when a write-back cycle or a write cycle is not occurring in the FRAM 102. When the switch S1 is closed, power is provided from the power supply VDD to the FRAM 102 and the capacitor C1. When switch S1 is open, energy is provided to the FRAM 102 through the capacitor C1. In this example, the energy source is a capacitor.

Figure 2B:
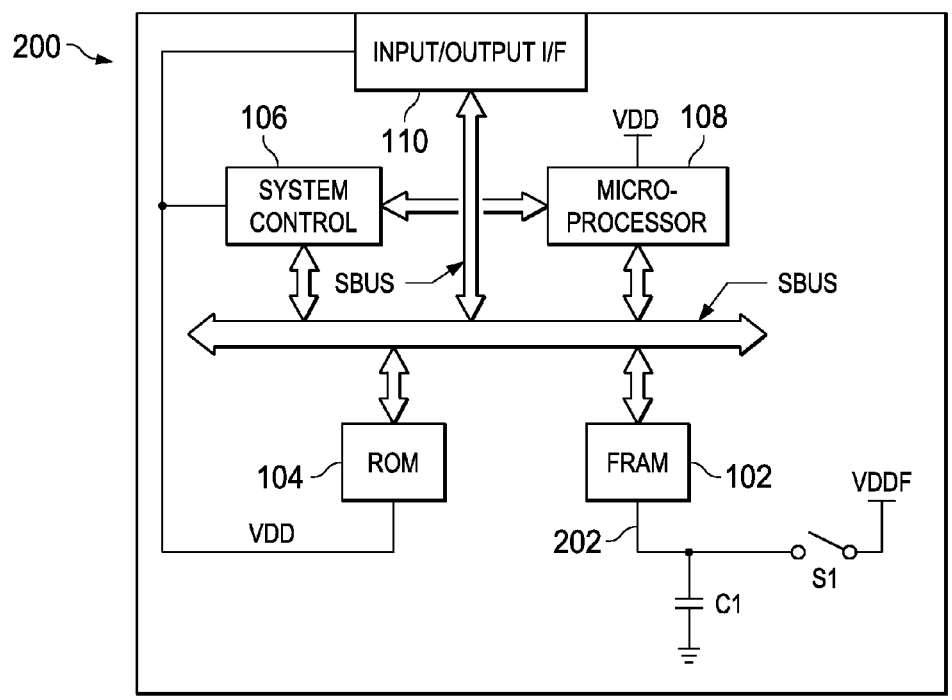
FIG. 2B is an electrical diagram, in block form, of a large scale integrated circuit incorporating a ferroelectric memory, constructed according to embodiments of the invention.

FIG. 2B is an electrical diagram, in block form, of a large scale integrated circuit incorporating a ferroelectric memory, constructed according to embodiments of the invention. In this embodiment of the invention, a switch S1 has been added between a power supply VDDF and the power terminal 202 for FRAM 102. In this example, the power supply VDDF only provides power to the FRAM 102. The power supply VDD is used to supply power to the other parts of the chip. In addition, a capacitor C1 is electrically connected to the power terminal 202. In this example a single capacitor C1 is used. However, additional capacitors may be added in parallel with C1 in other embodiments. The switch S1 is "open" (i.e. not electrically connected to power terminal 202) when a write-back cycle or a write cycle occurs in the FRAM 102. The switch S1 is "closed" (i.e. electrically connected to power terminal 202) when a write-back cycle or a write cycle is not occurring in the FRAM 102. When the switch S1 is closed, power is provided from the power supply VDD to the FRAM 102 and the capacitor C1. When switch S1 is open, energy is provided to the FRAM 102 through the capacitor C1. In this example, the energy source is a capacitor.

Figure 3:
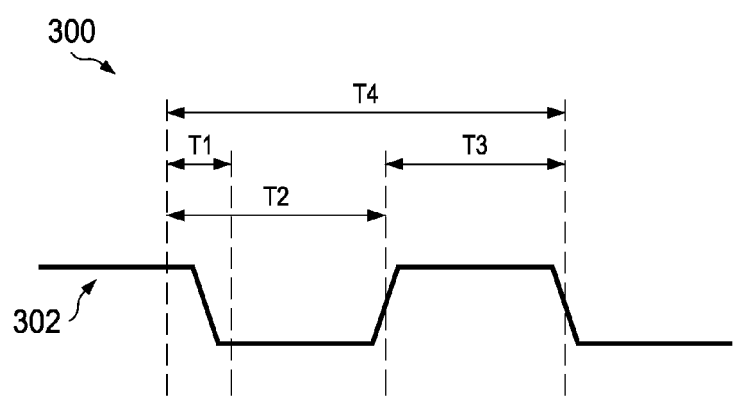
FIG. 3 is a timing diagram illustrating the isolation of the FRAM memory from a power supply during the write and write-back of the FRAM memory according to embodiments of the invention.

A read/write (RW) signal 302 is shown in FIG. 3. During time t2 when the RW signal 302 is low, data may be read from the FRAM 102. However, since reading a FRAM can be destructive (i.e. change the stored the value of the stored data), a write-back cycle to the FRAM 102 must follow a read cycle. The write-back cycle time t3 is shown in FIG. 3 where the RW signal 302 changes from a zero to one. The time t4 for a read cycle followed by a write-back cycle is also shown in FIG. 3. In this example, when the RW signal 302 transitions from a one to a zero during time t1, it is known that a read cycle followed immediately by a write-back cycle will occur. Because it is know that a read cycle followed immediately by a write-back cycle will occur when the RW signal 302 transitions from a one to a zero during time t1, this transition can be used to control when switch S1 is opened or closed. In this example, the switch S1 will be open when the write-back cycle occurs during time t3. The RW signal 302 may also be used to control when the switch S1 is open during a write cycle (not shown in FIG. 3).

Figure 4A:
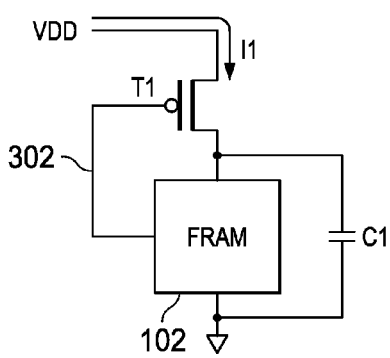
FIG. 4A is an electrical diagram, in block form, of a ferroelectric memory electrically connected to a power supply during a read cycle according to embodiments of the invention.

FIG. 4A is an electrical diagram, in block form, of a ferroelectric memory electrically connected to a power supply during a read cycle according to embodiments of the invention. In this example, the RW signal 302 is low during the read cycle of the FRAM 102. Because the RW signal 302 is low, the PFET (p-type Field-Effect Transistor) is turned on and current I1 is supplied to the FRAM 102 and to the capacitor C1. In this example a PFET was used. However, other transistor configurations may be used to implement the function of supplying current I1 to FRAM 102 and to capacitor C1.

Figure 4B:
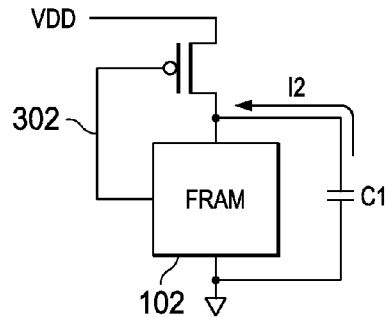
FIG. 4B is an electrical diagram, in block form, of a ferroelectric memory electrically disconnected from a power supply during a write cycle according to embodiments of the invention.

FIG. 4B is an electrical diagram, in block form, of a ferroelectric memory electrically disconnected from a power supply during a write cycle according to embodiments of the invention. In this example, the RW signal 302 is high during a write cycle of the FRAM 102. Because the RW signal 302 is high, the PFET (p-type Field-Effect Transistor) is turned off and current I2 is supplied to the FRAM 102 from capacitor C1. In this example a PFET was used. However, other transistor configurations may be used to implement the function of supplying current I2 to FRAM 102 from capacitor C1.

Figure 5:
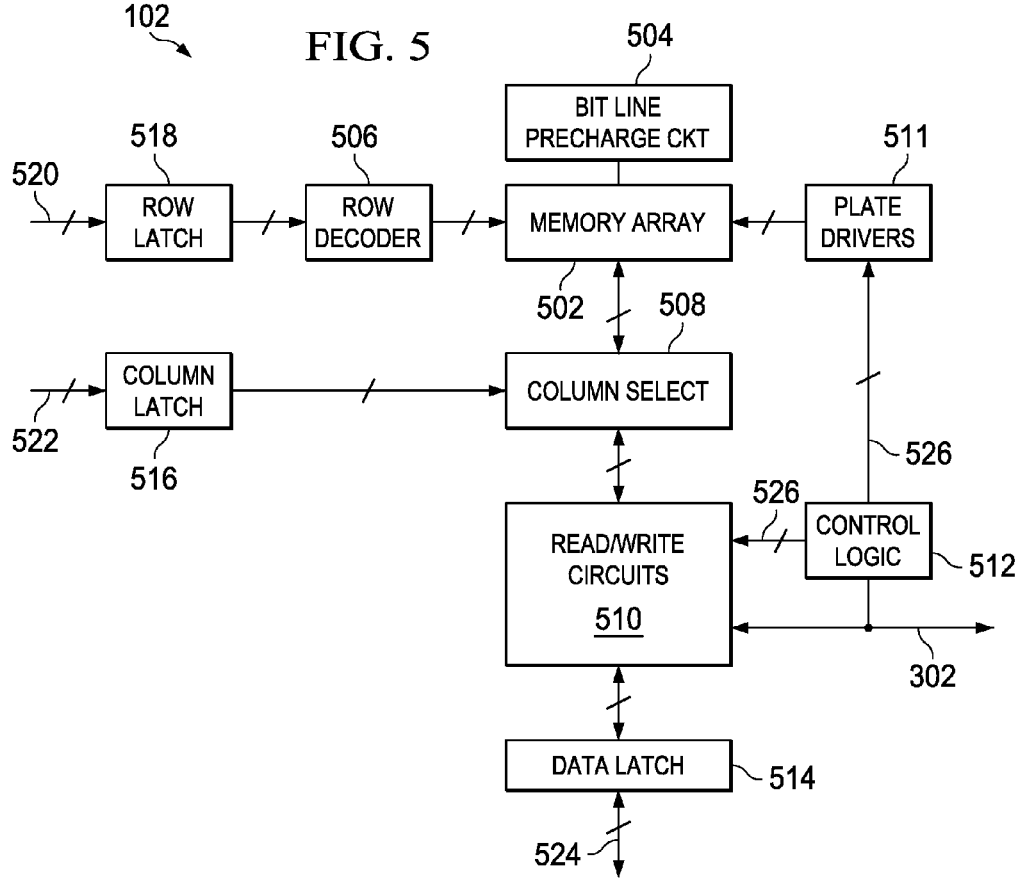
FIG. 5 is an electrical diagram, in block form, of an FRAM memory according to embodiments of the invention.

FIG. 5 is an electrical diagram, in block form, of an FRAM memory according to embodiments of the invention. In this embodiment of the invention, an FRAM 102 includes a memory array 502, bit line precharge circuitry 504, a row decoder 506, a column select block 508, a read/write circuit block 510, a plate driver block 511, logic control block 512, data latch block 514, a column address latch block 516, a row address latch block 518, row address 520, column address 522, a control logic bus 526 and the RW control signal 302. In this embodiment, before a read or write cycle occurs, the row address 520 is latched into the row address latch block 518, the column address 522 is latched into the column address latch block 516 and data 524 is latched into the data latch block 514. Because the address 520 and 522 and the data 524 are latched before write or write-back cycles, the power supply VDD may be disconnected from the FRAM 102 during a write or a write-back cycle and data may be written to the memory array 502. Energy during a write or write-back cycle is provided by the capacitor C1. In this example the RW control signal is used to control when the switch S1 is open or closed.

Figure 6:
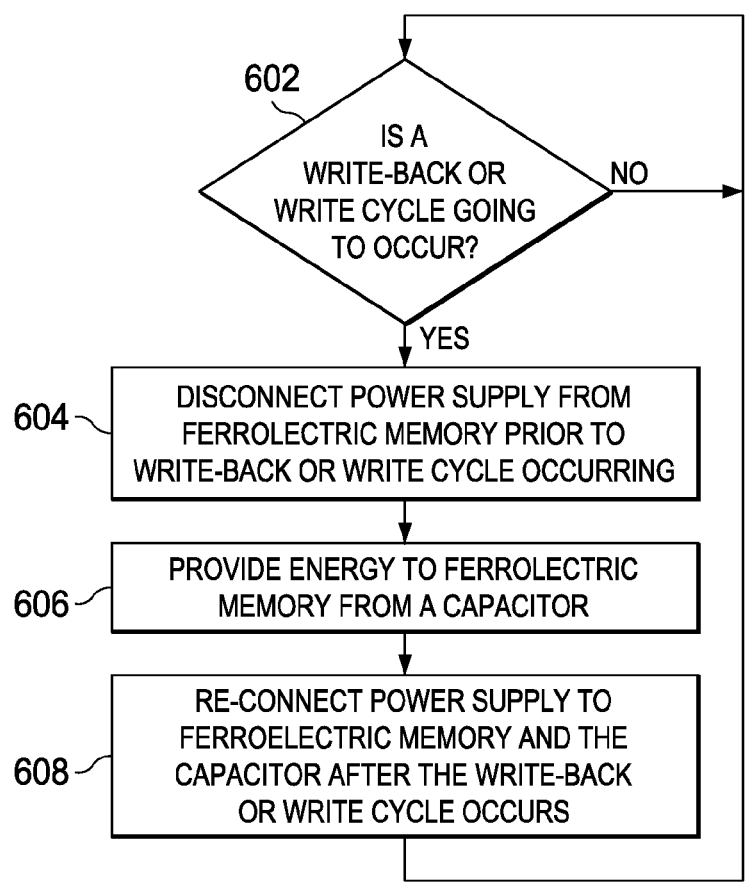
FIG. 6 is a flow diagram illustrating a method of isolating an FRAM memory from a power supply during a write cycle or a write-back cycle according to an embodiment of the invention.

FIG. 6 is a flow diagram illustrating a method of isolating an FRAM memory from a power supply according to an embodiment of the invention. During step 602 the method determines if a write-back or write cycle will occur. If the method determines that a write-back or write cycle will occur, a power supply VDD is disconnected from the FRAM memory 102 prior to the write-back or write cycle occurring, 604. During step 606, energy is provided to the ferroelectric memory from capacitor C1. After the write-back or write cycle occurs, the power supply VDD is reconnected to the ferroelectric memory 102 and the capacitor 102.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of isolating a ferroelectric memory from a power supply during a write-back cycle, the method comprising the steps of:
   determining when a write-back cycle will occur;
   disconnecting the power supply from the ferroelectric memory prior to the write-back cycle occurring;
   providing energy to the ferroelectric memory from at least one energy source after disconnecting the power supply from the ferroelectric memory; and
   connecting the power supply to the ferroelectric memory and the at least one energy source after the write-back cycle has ended.

2. The method of claim 1 wherein the at least one energy source is at least one capacitor.

3. The method of claim 1 wherein the step of determining when a write-back cycle will occur is performed responsive to a transition from one binary logical state to another binary logical state of a read/write (RW) control signal produced on the ferroelectric memory.

4. The method of claim 1 further comprising:
   latching all row addresses of the ferroelectric memory when it is determined that a write-back cycle will occur and keeping all row addresses latched until after the write-back cycle has occurred,
   latching all column addresses of the ferroelectric memory when it is determined that a write-back cycle will occur and keeping all column addresses latched until after the write-back cycle has occurred; and
   latching all data being written to the ferroelectric memory when it is determined that a write-back cycle will occur and keeping all data being written to the ferroelectric memory until after the write-back cycle has occurred.

5. A method of isolating a ferroelectric memory from a power supply during a write cycle, the method comprising the steps of:
   determining when a write cycle will occur;
   disconnecting the power supply from the ferroelectric memory prior to the write cycle occurring;
   providing energy to the ferroelectric memory from at least one energy source after disconnecting the power supply from the ferroelectric memory; and
   connecting the power supply to the ferroelectric memory and the at least one energy source after the write cycle has ended.

6. The method of claim 5 wherein the at least one energy source is at least one capacitor.

7. The method of claim 5 wherein the step of determining when a write cycle will occur is performed responsive to a transition from one binary logical state to another binary logical state of a read/write (RW) control signal produced on the ferroelectric memory.

8. The method of claim 5 further comprising:
   latching all row addresses of the ferroelectric memory when it is determined that a write-back cycle will occur and keeping all row addresses latched until after the write cycle has occurred,
   latching all column addresses of the ferroelectric memory when it is determined that a write cycle will occur and keeping all column addresses latched until after the write cycle has occurred; and
   latching all data being written to the ferroelectric memory when it is determined that a write cycle will occur and keeping all data being written to the ferroelectric memory until after the write cycle has occurred.

9. An integrated circuit (IC), comprising:
   a ferroelectric memory having a first terminal and a second terminal wherein the second terminal is electrically connected to a ground of the integrated circuit;
   at least one capacitor having a first electrode electrically connected to the first terminal of the ferroelectric memory and a second electrode electrically connected to the ground of the integrated circuit;
   a power supply having a voltage VDD; and
   an electrical switch having a first terminal and a second terminal, the first terminal of the electrical switch electrically connected to VDD wherein the second terminal of the electrical switch is not electrically connected to the first terminal of the ferroelectric memory during a write-back cycle; and
   wherein the second terminal of the electrical switch is electrically connected to the first terminal of the ferroelectric memory when the ferroelectric memory is not executing the write-back cycle.

10. The integrated circuit of claim 9 wherein the ferroelectric memory provides a binary read/write (RW) signal that indicates when a write-back cycle occurs.

11. The integrated circuit of claim 10 wherein the electrical switch comprises a transistor.

12. The integrated circuit of claim 11 wherein the transistor is a P-type Field-Effect Transistor (PFET) having a gate, a source and a drain wherein the drain is electrically connected to the second terminal of the electrical switch, the source is electrically connected to the first terminal of the electrical switch and the RW signal is electrically connected to the gate of the PFET;
   wherein when a write-back cycle is not occurring, the RW signal is a logical zero; and
   wherein when a write-back cycle is occurring, the RW signal is a logical one.

13. An integrated circuit (IC) comprising:
   a ferroelectric memory having a first terminal and a second terminal wherein the second terminal is electrically connected to a ground of the integrated circuit;
   at least one capacitor having a first electrode electrically connected to the first terminal of the ferroelectric memory and a second electrode electrically connected to the ground of the integrated circuit;
   a power supply having a voltage VDD; and
   an electrical switch having a first terminal and a second terminal, the first terminal of the electrical switch electrically connected to VDD wherein the second terminal of the electrical switch is not electrically connected to the first terminal of the ferroelectric memory during a write cycle; and
   wherein the second terminal of the electrical switch is electrically connected to the first terminal of the ferroelectric memory when the ferroelectric memory is not executing the write cycle.

14. The system of claim 13 wherein the ferroelectric memory provides a binary read/write (RW) signal that indicates when a write cycle will occur.

15. The system of claim 14 wherein the electrical switch comprises a transistor.

16. The system of claim 15 wherein the transistor is a P-type Field-Effect Transistor (PFET) having a gate, a source and a drain wherein the drain is electrically connected to the second terminal of the electrical switch, the source is electrically connected to the first terminal of the electrical switch and the RW signal is electrically connected to the gate of the PFET;
- wherein when a write cycle is not occurring, the RW signal is a logical zero; and
- wherein when a write cycle is occurring, the RW signal is a logical one.

17. A system comprising:

a microprocessor;

a ferroelectric memory having a first terminal and a second terminal wherein the second terminal is electrically connected to a ground of the integrated circuit;

at least one capacitor having a first electrode electrically connected to the first terminal of the ferroelectric memory and a second electrode electrically connected to the ground of the integrated circuit;

a first power supply; and an electrical switch having a first terminal and a second terminal, the first terminal of the electrical switch electrically connected to the first power supply wherein the second terminal of the electrical switch is not electrically connected to the first terminal of the ferroelectric memory during a write cycle; and wherein the second terminal of the electrical switch is electrically connected to the first terminal of the ferroelectric memory when the ferroelectric memory is not executing the write cycle.

18. The system of claim 17 wherein power is provided to the microprocessor by a second power supply having a voltage VDD.

19. The system of claim 17 wherein the voltage of the first power supply is VDDF.

* * * * *